(12) United States Patent
Li et al.

(10) Patent No.: US 10,180,603 B2
(45) Date of Patent: Jan. 15, 2019

(54) ARRAY SUBSTRATE AND METHOD OF MANUFACTURING THE SAME, DISPLAY PANEL AND DISPLAY DEVICE

(71) Applicant: BOE Technology Group Co., Ltd., Beijing (CN)

(72) Inventors: Wenbo Li, Beijing (CN); Hongfei Cheng, Beijing (CN); Pan Li, Beijing (CN); Jianbo Xian, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/324,938

(22) PCT Filed: Feb. 4, 2016

(86) PCT No.: PCT/CN2016/073514
§ 371 (c)(1),
(2) Date: Jan. 9, 2017

(87) PCT Pub. No.: WO2017/041429
PCT Pub. Date: Mar. 16, 2017

(65) Prior Publication Data
US 2017/0219890 A1 Aug. 3, 2017

(30) Foreign Application Priority Data
Sep. 9, 2015 (CN) ............... 2015 2 0696342 U

(51) Int. Cl.
*H01L 21/00* (2006.01)
*G02F 1/1343* (2006.01)
(Continued)

(52) U.S. Cl.
CPC ...... *G02F 1/134309* (2013.01); *G02F 1/1368* (2013.01); *G02F 1/13439* (2013.01);
(Continued)

(58) Field of Classification Search
None
See application file for complete search history.

(56) References Cited

U.S. PATENT DOCUMENTS

| 7,940,346 B2 | 5/2011 | You et al. |
| 8,174,636 B2 | 5/2012 | Chen et al. |

(Continued)

FOREIGN PATENT DOCUMENTS

| CN | 101354512 A | 1/2009 |
| CN | 101364017 A | 2/2009 |

(Continued)

OTHER PUBLICATIONS

International Search Report and Written Opinion of International Application No. PCT/CN2016/073514, dated Jun. 15, 2016, 11 pages.

(Continued)

*Primary Examiner* — Reema Patel
(74) *Attorney, Agent, or Firm* — Westman, Champlin & Koehler, P.A.

(57) ABSTRACT

The disclosure provides an array substrate, a display panel and a display device, for increasing a viewing angle of the display device. The array substrate includes a plurality of data lines and a plurality of gate lines arranged to cross each other, and a column of pixel units between adjacent data lines, at least one pixel unit each includes at least two sub-pixel electrodes, a voltage compensation unit for charging at least one sub-pixel electrode of the pixel unit and a voltage division unit for reducing a voltage on at least one of other sub-pixel electrodes of the pixel unit. The voltage compensation unit and the voltage division unit are adjusted such that voltages on sub-pixel electrodes are not all the same, thereby deflection angles of liquid crystal molecules located within regions corresponding to the sub-pixel electrode are different from each other, enabling wide viewing-angle display of the display device.

20 Claims, 6 Drawing Sheets

(51) Int. Cl.
 *G02F 1/1333* (2006.01)
 *G02F 1/1362* (2006.01)
 *G02F 1/1368* (2006.01)
 *H01L 27/12* (2006.01)

(52) U.S. Cl.
 CPC .... *G02F 1/13624* (2013.01); *G02F 1/133345* (2013.01); *G02F 1/136213* (2013.01); *G02F 1/136286* (2013.01); *H01L 27/124* (2013.01); *H01L 27/1255* (2013.01); *H01L 27/1259* (2013.01); *G02F 2001/134345* (2013.01); *G02F 2201/121* (2013.01); *G02F 2201/123* (2013.01)

(56) References Cited

U.S. PATENT DOCUMENTS

| | | | |
|---|---|---|---|
| 8,520,160 B2 | 8/2013 | You et al. | |
| 9,159,279 B2 | 10/2015 | Chen et al. | |
| 9,466,248 B2 | 10/2016 | You et al. | |
| 9,557,614 B2 | 1/2017 | Cheng et al. | |
| 2008/0186304 A1* | 8/2008 | You | G09G 3/3659 345/212 |
| 2010/0253869 A1 | 10/2010 | Ting et al. | |
| 2016/0291367 A1 | 10/2016 | Cheng et al. | |

FOREIGN PATENT DOCUMENTS

| | | |
|---|---|---|
| CN | 101504503 A | 8/2009 |
| CN | 103488018 A | 1/2014 |
| CN | 204065625 U | 12/2014 |
| CN | 204101858 U | 1/2015 |
| CN | 204925571 U | 12/2015 |

OTHER PUBLICATIONS

English translation of Box No. V of the Written Opinion for the International Searching Authority for International Application No. PCT/CN2016/073514, 2 pages.
Extended European search report for European Patent Application No. 16819415.7, dated Feb. 6, 2018, 8 pages.

* cited by examiner

ARRAY SUBSTRATE AND METHOD OF MANUFACTURING THE SAME, DISPLAY PANEL AND DISPLAY DEVICE

CROSS-REFERENCE TO RELATED APPLICATION

This application is a Section 371 National Stage Application of International Application No. PCT/CN2016/073514, filed on 4 Feb. 2016, entitled "ARRAY SUBSTRATE, DISPLAY PANEL AND DISPLAY DEVICE", which has not yet published, and which claims priority to Chinese Application No. 201520696342.1, filed on 9 Sep. 2015, incorporated herein by reference in their entirety.

BACKGROUND

Technical Field

Embodiments of the present disclosure generally relate to the field of display technologies, and particularly, to an array substrate and a method of manufacturing the same, a display panel and a display device.

Description of the Related Art

Liquid crystal display has become dominant in flat panel display recently due to its characteristics such as small volume, low power consumption, no radiation and the like. The size of the liquid crystal display has become larger and larger, thus there is higher requirement for a range of viewing angle of the liquid crystal display.

In a conventional liquid crystal display, liquid crystal molecules are generally driven to deflect by a vertical electric field between a pixel electrode and a common electrode line, thus when viewing from a side of the liquid crystal display, there are low contrast and color distortion, that is, there is a problem related to a narrow viewing angle. In order to solve the above problem, there has proposed a liquid crystal display comprising an array substrate, which comprises a plurality of data lines and a plurality of gate lines, adjacent data lines define a column of pixel units, each pixel unit comprises two sub-pixel electrodes and a storage capacitor, and one of the sub-pixel electrodes is discharged through the storage capacitor, such that voltages on the two sub-pixel electrodes are different from each other, and thus such that deflection angles of the liquid crystal molecules located within regions corresponding to the two sub-pixel electrodes are different from each other, thereby improving the viewing angle of the liquid crystal display.

However, since the charges on both two sub-pixel electrodes will be consumed, a voltage difference between the two sub-pixel electrodes may decrease when the charges on the two sub-pixel electrodes are consumed by different amounts, so that a difference between deflection angles of the liquid crystal molecules located within regions corresponding to the two sub-pixel electrodes will be smaller, thereby the improvement of the viewing angle of the liquid crystal display is not significant; in other words, there is still a problem of narrower viewing angle in existing display devices.

SUMMARY

An object of the present disclosure is to provide an array substrate, for improving the viewing angle of a display device.

In order to achieve the above object, the present disclosure provides following technical schemes:

An array substrate comprises a plurality of data lines and a plurality of gate lines arranged to cross each other, and a column of pixel units being disposed between adjacent data lines, wherein each of at least one pixel unit comprises at least two sub-pixel electrodes, a voltage compensation unit configured to charge at least one sub-pixel electrode of the pixel unit and a voltage division unit configured to reduce a voltage on at least one of other sub-pixel electrodes of the pixel unit.

In the array substrate provided according to the present disclosure, the voltage compensation unit configured to charge a sub-pixel electrode and the voltage division unit configured to reduce a voltage on a sub-pixel electrode are provided for the sub-pixel electrodes of the pixel unit, and are adjusted such that voltages of respective sub-pixel electrodes are not all the same, thereby deflection angles of liquid crystal molecules located within regions corresponding to the sub-pixel electrode are different from each other, thereby enabling wide viewing-angle display of the display device.

Another object of the present disclosure is to provide a display panel, for improving the viewing angle of a display device. The display panel comprises the array substrate provided in the above technique scheme. Advantages of the display panel are the same as those of the above array substrate over prior arts and will not be repeatedly described herein.

A further object of the present disclosure is to provide a display device with an improved viewing angle. The display device comprises the display panel provided in the above technique scheme. Advantages of the display device are the same as those of the above display panel over prior arts and will not be repeatedly described herein.

BRIEF DESCRIPTION OF THE DRAWINGS

Accompanying drawings are used to provide a further understanding of the present disclosure, and constitute parts of the present disclosure. Exemplary embodiments of the present disclosure and description thereof are intended to illustrate the present disclosure and should not be interpreted as being inappropriate limitative to the present disclosure. In drawings.

LISTS OF REFERENCE NUMERALS

10—gate line, 11—auxiliary gate line,
20—data line, 31—first sub-pixel electrode, 32—second sub-pixel electrode, 33—third sub-pixel electrode, 34—fourth sub-pixel electrode, 41—first thin film transistor, 411—gate of first thin film transistor, 412—drain electrode of first thin film transistor, 413—source electrode of first thin film transistor, 42—second thin film transistor, 421—gate of second thin film transistor, 422—drain electrode of second thin film transistor, 423—source electrode of second thin film transistor, 51—voltage compensation unit, 52—voltage division unit, 61—common electrode line, 62—auxiliary electrode, 71—first through hole, 72—second through hole, 73—auxiliary through hole, 81—gate insulation layer, 82—base substrate, 83—passivation layer, 84—active layer, 91—voltage compensation capacitor, and 92—voltage division capacitor.

DETAILED DESCRIPTION OF PREFERRED EMBODIMENTS

In the following, an array substrate, a display panel and a display device according to embodiments of the present disclosure will be further described in detail with reference to the drawings.

Figure 1:
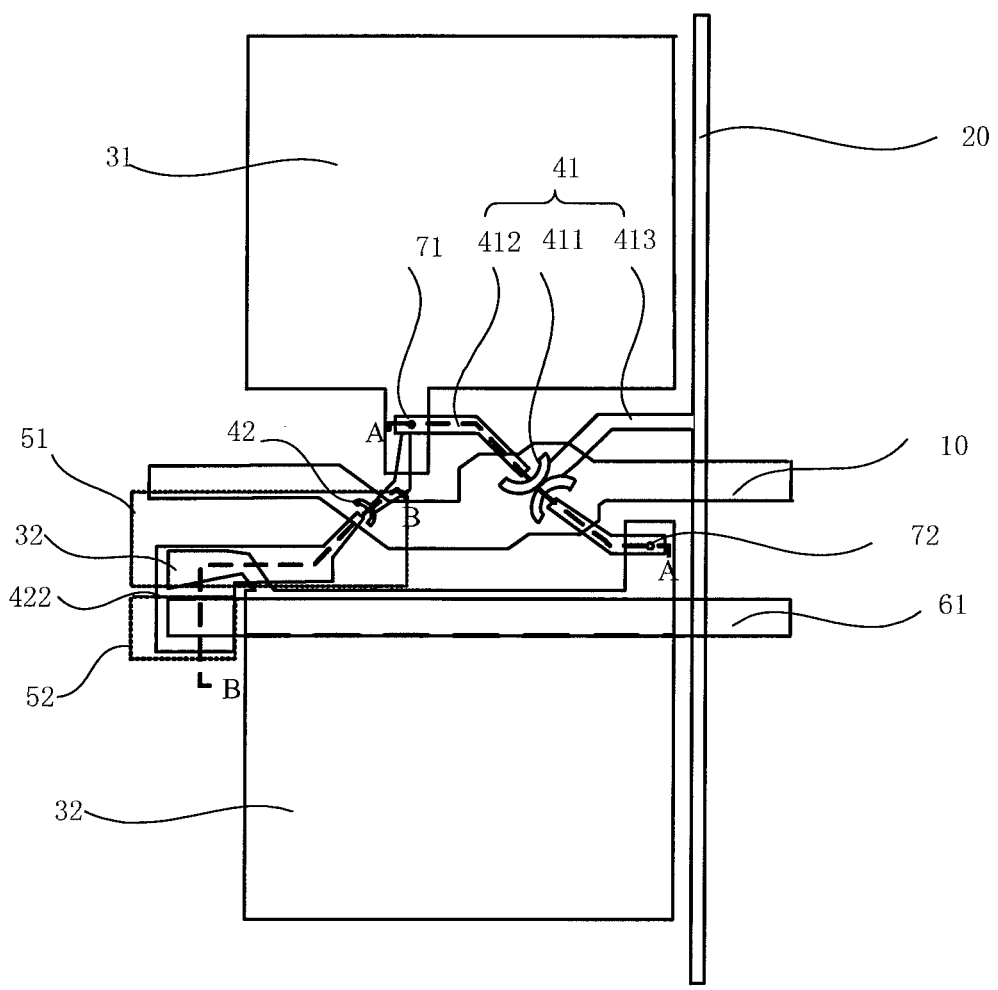
FIG. 1 is a structural schematic diagram of an array substrate according to an exemplary embodiment of the present disclosure.

Referring to FIG. 1, an embodiment of the present disclosure provides an array substrate, comprising a plurality of data lines 20 and a plurality of gate lines 10 arranged to cross each other, and a column of pixel unit being disposed between adjacent data lines 20, each of at least one pixel unit comprises at least two sub-pixel electrodes independent of each other, and first thin film transistors configured to control charging and discharging of corresponding sub-pixel electrodes, for example, a first thin film transistor 41 comprising a gate 411, a drain electrode 412, and a source electrode 413; each of the at least one pixel unit further comprises a voltage compensation unit 51 configured to charge at least one sub-pixel electrode of the pixel unit and a voltage division unit 52 configured to reduce a voltage on at least one of other sub-pixel electrodes of the pixel unit.

In the array substrate provided according to the embodiment of the present disclosure, the pixel unit is provided with the voltage compensation unit 51 configured to charge a sub-pixel electrode and the voltage division unit 52 configured to reduce a voltage on a sub-pixel electrode, and the voltage compensation unit 51 and the voltage division unit 52 are adjusted such that voltages on respective sub-pixel electrodes are not all the same, thereby deflection angles of liquid crystal molecules located within regions corresponding to the sub-pixel electrode are different from each other, thereby enabling wide viewing-angle display of the display device.

Figure 2:
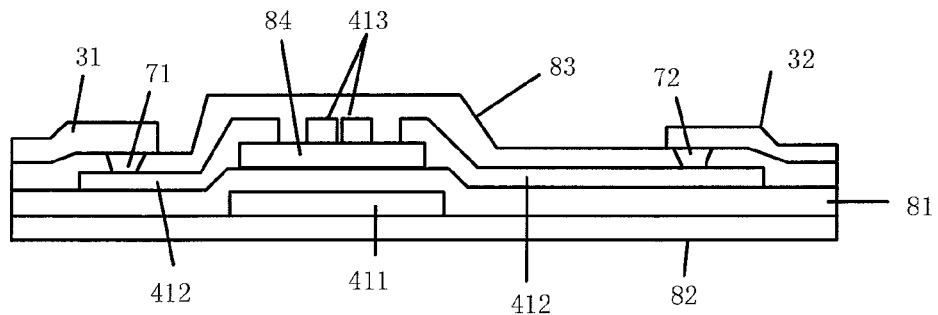
FIG. 2 is a cross sectional view of the array substrate taken along an A-A direction shown in FIG. 1.
Figure 3:
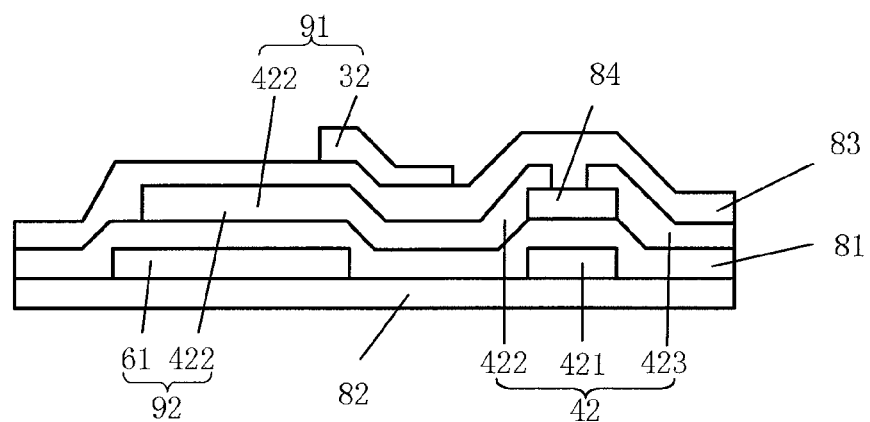
FIG. 3 is a cross sectional view of the array substrate taken along an B-B direction shown in FIG. 1.

The number of the sub-pixel electrodes of the above pixel unit may be two or more, and an exemplary embodiment of the present disclosure will be described by taking a pixel unit including two sub-pixel electrodes as an example. Referring to FIG. 1, FIG. 2 and FIG. 3, each of at least some of pixel units comprises two sub-pixel electrodes including a first sub-pixel electrode 31 and a second sub-pixel electrode 32; the pixel unit may further comprise a common electrode line 61 disposed between a gate insulation layer 81 and a base substrate 82 of the array substrate, the voltage compensation unit 51 is electrically connected to the first sub-pixel electrode 31 and the second sub-pixel electrode 32 respectively, and the voltage division unit 52 is electrically connected to the first sub-pixel electrode 31 and the common electrode line 61. During operation of the above array substrate, the first thin film transistors 41 are in an on state or switch-on state when the gate lines 10 are applied with a scan signal, such that the data lines 20 charges corresponding first sub-pixel electrodes 31 and second sub-pixel electrodes 32 through respective first thin film transistors 41, and at the same time, a part of charges on the first sub-pixel electrode 31 will flow into the voltage division unit 52 and the voltage compensation unit 51. Since the first sub-pixel electrode 31 and the second sub-pixel electrode 32 are charged for a same charging time, the voltage on the charged first sub-pixel electrode 31 is lower than that on the charged second sub-pixel electrode 32, such that a deflection angle of liquid crystal molecules located within a region corresponding to the first sub-pixel electrode 31 is different from a deflection angle of liquid crystal molecules located within a region corresponding to the second sub-pixel electrode 32, thereby improving a viewing angle of a display device; meanwhile, even if the charges on the second sub-pixel electrode 32 are somewhat consumed, the second sub-pixel electrode 32 will be supplemented with charges from the voltage compensation unit 51, such that the voltage on the second sub-pixel electrode 32 is always higher than the voltage on the first sub-pixel electrode 31, thereby further improving the viewing angle of the display device.

It will be understood that some or all of the pixel units of the display device may be provided with the voltage compensation unit and the voltage division unit described above according to different requirements for the viewing angle, and voltages on some or all of the sub-pixel electrodes of the pixel unit provided with the voltage compensation unit and the voltage division unit may be different from one another.

It is noted that in FIG. 1, the voltage division unit 52 and the voltage compensation unit 51 may be electrically connected with the first sub-pixel electrode 31 respectively through a common connection structure (for example, the second thin film transistor 42 shown in FIG. 3), and due to limitation by the selected viewing angle shown in the drawings, the drawings do not show specific electrical connections of the voltage division unit 52 and the voltage compensation unit 51 with the first sub-pixel electrode 31 through the common connection structure. Of course, the voltage division unit 52 and the voltage compensation unit 51 may be also electrically connected with the first sub-pixel electrode 31 respectively through common connection structures independent of each other. This is also applied in other embodiments.

In order to control charges flowing out from the first sub-pixel electrode 31, the voltage division unit 52 is provided with a voltage division capacitor 92 and a voltage division thin film transistor, and the voltage compensation unit 51 is provided with a voltage compensation capacitor 91 and a voltage compensation thin film transistor. Charges flowing into the voltage division capacitor 92 from the first sub-pixel electrode 31 may be controlled by adjusting electrical parameters of the voltage division thin film transistor, and/or charges flowing into the voltage compensation capacitor 91 from the first sub-pixel electrode 31 may be controlled by adjusting electrical parameters of the voltage compensation thin film transistor. The electrical parameters of the voltage division thin film transistor and/or the voltage compensation thin film transistor include a mobility, a width to length ratio of a channel and the like. In an example, the width to length ratio of a channel of the voltage division thin film transistor is less than a width to length ratio of a channel of the first thin film transistor 41, and the width to length ratio of a channel of the voltage compensation thin film transistor is less than the width to length ratio of the channel of the first thin film transistor 41.

The voltage division unit 52 and the voltage compensation unit 51 described above may share one thin film transistor, that is, the above voltage division thin film transistor and the voltage compensation thin film transistor may be a same one thin film transistor; when the above voltage division thin film transistor and the voltage compensation thin film transistor are a same one thin film transistor, the same one thin film transistor is defined as the second thin film transistor 42 shown in FIG. 3, and the second thin film transistor 42 is the common connection structure electrically connecting the voltage division unit 52 and the voltage compensation unit 51 with the first sub-pixel electrode 31 respectively. The second thin film transistor 42 has a source electrode 423 electrically connected with the first sub-pixel electrode 31, a gate 421 electrically connected with the gate lines 10, and a drain electrode 422 disposed between a passivation layer 83 and the gate insulation layer 81 of the array substrate; the voltage division capacitor 92 has one electrode electrically connected with the drain electrode 422 of the second thin film transistor 42 and the other electrode electrically connected with the common electrode line 61; and the voltage compensation capacitor 91 has one electrode electrically connected with the drain electrode 422 of the second thin film transistor 42 and the other electrode electrically connected with the second sub-pixel electrode 32.

During operation of the above array substrate, the first thin film transistors 41 are in an on state or switch-on state when the gate lines 10 are applied with a scan signal, such that the data lines 20 charges corresponding first sub-pixel electrodes 31 and second sub-pixel electrodes 32 through respective first thin film transistors 41, and at the same time, a part of charges on the first sub-pixel electrode 31 will flow into the voltage division capacitor 92 and the voltage compensation capacitor 91 respectively through the second thin film transistor 42. Since the first sub-pixel electrode 31 and the second sub-pixel electrode 32 are charged for a same charging time, the voltage on the charged first sub-pixel electrode 31 is lower than that on the charged second sub-pixel electrode 32, such that a deflection angle of liquid crystal molecules located within a region corresponding to the first sub-pixel electrode 31 is different from a deflection angle of liquid crystal molecules located within a region corresponding to the second sub-pixel electrode 32, thereby improving a viewing angle of a display device; and meanwhile, after the charges on the second sub-pixel electrode 32 are somewhat consumed, the second sub-pixel electrode 32 will be supplemented with charges from the voltage compensation capacitor 92, such that the difference between voltages on the second sub-pixel electrode 32 and the first sub-pixel electrode 31 is increased and the voltage on the second sub-pixel electrode 32 is always higher than the voltage on the first sub-pixel electrode 31, thereby further improving the viewing angle of the display device.

The gate 411 of the above first thin film transistor 41 and the gate 421 of the second thin film transistor 42 are electrically connected with a same one gate line, thus the first thin film transistor 41 and the second thin film transistor 42 will be in the on state for the same time.

Figure 4:
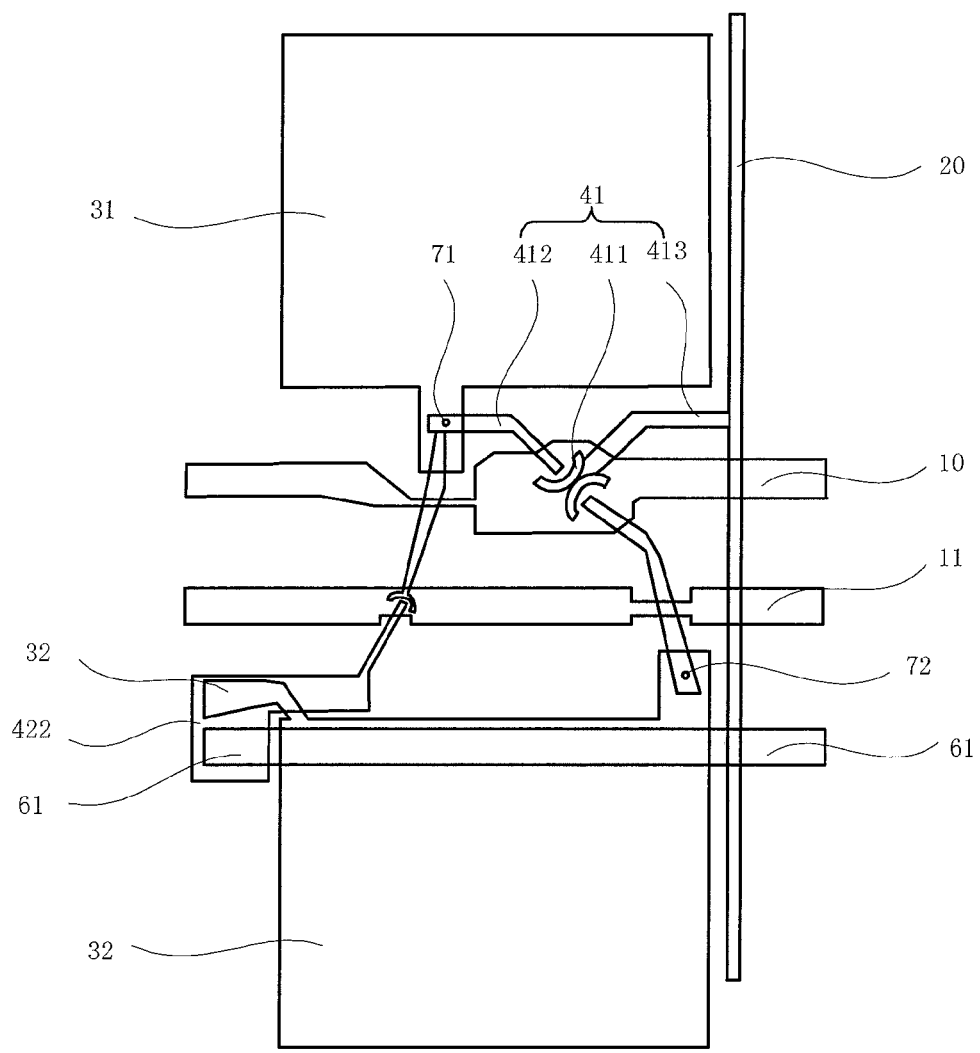
FIG. 4 is a structural schematic diagram of an array substrate according to another exemplary embodiment of the present disclosure.

In order to more accurately control the time for which the second thin film transistor 42 is in the on state or switch-on state, in another embodiment, as shown in FIG. 4, the pixel unit may further comprise an auxiliary gate line 11, to which the gate 421 of the second thin film transistor 42 is electrically connected, and the source electrode 422 of the second thin film transistor 42 is electrically connected with the first sub-pixel electrode 31. For example, the auxiliary gate line may be located between the first sub-pixel electrode 31 and the second sub-pixel electrode 32, and the drain electrode 422 of the second thin film transistor 42 is disposed between the passivation layer 83 and the gate insulation layer 81; the voltage division capacitor 92 has one electrode electrically connected with the drain electrode 422 of the second thin film transistor 42 and the other electrode electrically connected with the common electrode line 61; and the voltage compensation capacitor 91 has one electrode electrically connected with the drain electrode 422 of the second thin film transistor 42 and the other electrode electrically connected with the second sub-pixel electrode 32.

With such a configuration, the gate lines 10 controls on/off states of respective first thin film transistors 41 so as to charge corresponding second sub-pixel electrodes 32 and first sub-pixel electrodes 31, and the auxiliary gate line 11 controls on/off state of the second thin film transistor 42 to reduce the voltage on the first sub-pixel electrode 31, such that the first thin film transistor 41 and the second thin film transistor 42 may be in on state for different times; that is, the time for which the second thin film transistor 42 is in on state may be controlled through the auxiliary gate line 11, thereby controlling a voltage difference between the first sub-pixel electrode 31 and the second sub-pixel electrode 32. For example, when the width to length ratio of the channel of the first thin film transistor 41 is the same as the width to length ratio of the channel of the second thin film transistor 42, the time for which the second thin film transistor 42 is in on state will be less than the time for which the first thin film transistor 41 is in on state, in order to ensure that the charges on the first sub-pixel electrode 31 will not all flow out; the longer the time for which the second thin film transistor 42 is in on state is during an appropriate period, the lower the voltage on the first sub-pixel electrode 31 is, such that the voltage difference between the first sub-pixel electrode 31 and the second sub-pixel electrode 32 is larger, thereby further improving the viewing angle of the display device.

It will be noted that the auxiliary gate line 11 may also be arranged above the first sub-pixel electrode 31 shown in FIG. 4, or may be arranged below the second sub-pixel electrode 32 shown in FIG. 4.

Figure 5:
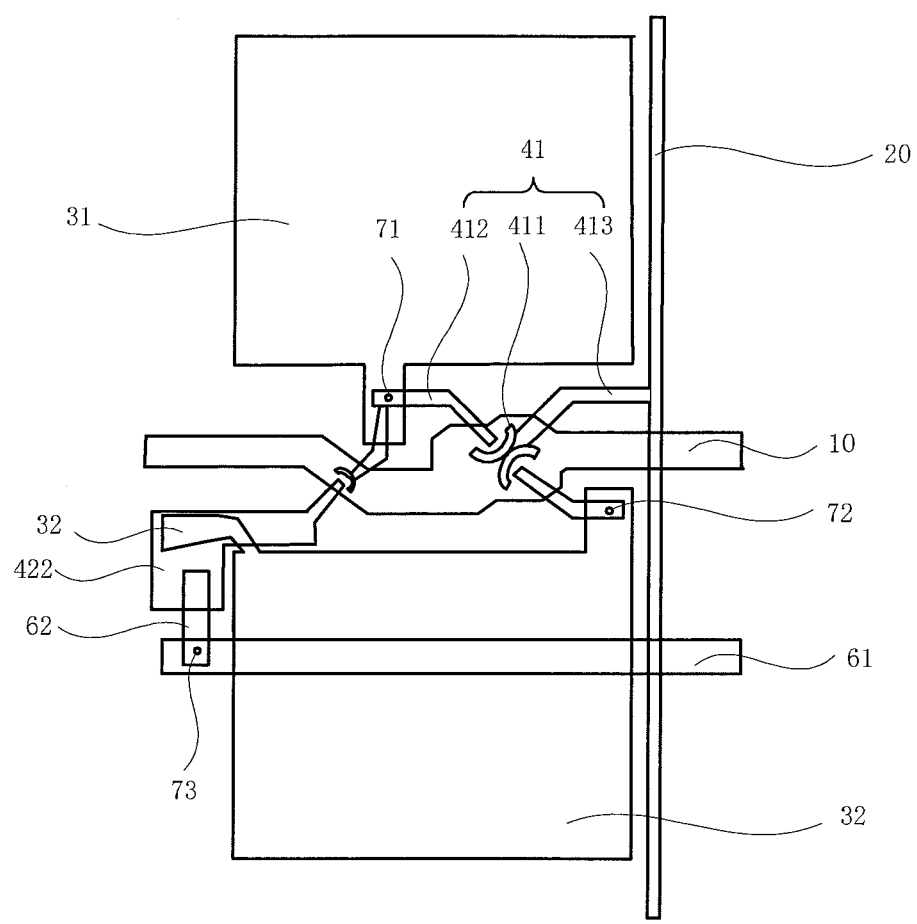
FIG. 5 is a structural schematic diagram of an array substrate according to a further exemplary embodiment of the present disclosure.

In each pixel unit described above, one electrode of the voltage division capacitor 92 may be electrically connected with the common electrode line 61 directly; or referring to FIG. 5, one electrode of the voltage division capacitor 92 may also be electrically connected with the common electrode line 61 through the auxiliary electrode 62, in such a case each pixel unit further comprises the auxiliary electrode 62, which is electrically connected with the common electrode line 61 through an auxiliary through hole 73, and to which one electrode of the voltage division capacitor 92 is electrically connected. For example, the auxiliary electrode 62 is located between the common electrode line 61 and the drain electrode 422 of the second thin film transistor 42, electrically connected with the common electrode line 61 through the auxiliary through hole 73, and electrically connected with the one electrode of the voltage division capacitor 92. A distance between the auxiliary electrode 62 and the drain electrode 422 of the second thin film transistor 42 in a thickness direction of array substrate is determined by the position of the auxiliary electrode 62, thus when the distance between the auxiliary electrode 62 and the drain electrode 422 of the second thin film transistor 42 in the thickness direction of array substrate is less than a distance between the common electrode line 61 and the drain electrode 422 of the second thin film transistor 42 in the thickness direction, a distance between the two electrodes of the voltage division capacitor 92 is decreased in the thickness direction, and the capacitance of the voltage division capacitor 92 is increased, such that the voltage difference between the first sub-pixel electrode 31 and the second sub-pixel electrode 32 is increased, thereby further improving the viewing angle of the display device.

In each pixel unit described above, the auxiliary electrode 62 and the second sub-pixel electrode 32 may be made of different materials and thus are respectively manufactured during manufacturing the array substrate; preferably, the auxiliary electrode 62 and the second sub-pixel electrode 32 are made of a same material and disposed in a same layer, such that during manufacturing the array substrate, the auxiliary electrode 62 and the second sub-pixel electrode 32 may be formed simultaneously in a same set of manufacturing processes, thereby simplifying processes of manufacturing the array substrate, reducing time of manufacturing the array substrate, and improving efficiency of manufacturing the array substrate.

In order to further improve the efficiency of manufacturing the array substrate, in a preferred embodiment, one electrode of the voltage division capacitor 92 and the drain electrode of the second thin film transistor 42 are formed into an integral structure, and the other electrode of the voltage division capacitor 92 and the common electrode line 61 are formed into an integral structure 61; and one electrode of the voltage compensation capacitor 91 and the drain electrode of the second thin film transistor 42 are formed into an integral structure, and the other electrode of the voltage compensation capacitor 91 and the second sub-pixel electrode 32 are formed into an integral structure. With such a configuration, during manufacturing the array substrate, one electrode of the voltage division capacitor 92 and the drain electrode of the second thin film transistor 42 may be formed simultaneously in a same set of manufacturing processes, and the other electrode of the voltage division capacitor 92 and the common electrode line 61 may be formed simultaneously in a same set of manufacturing processes; and the one electrode of the voltage compensation capacitor 91 and the drain electrode of the second thin film transistor 42 may be formed simultaneously in a same set of manufacturing processes, and the other electrode of the voltage compensation capacitor 91 and the second sub-pixel electrode 32 may be formed simultaneously in a same set of manufacturing processes, thereby simplifying processes of manufacturing the array substrate, reducing time of manufacturing the array substrate, and further improving efficiency of manufacturing the array substrate.

Figure 6:
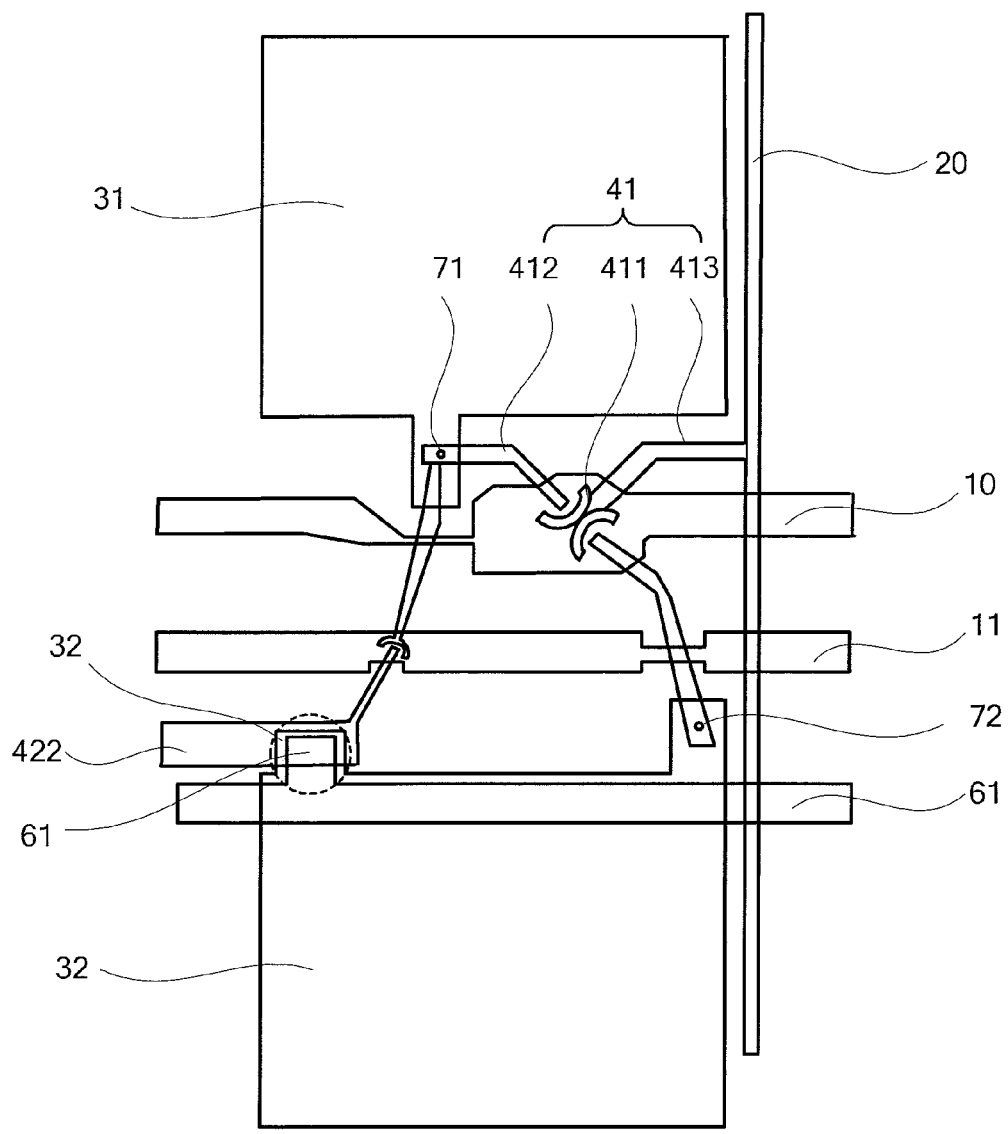
FIG. 6 is a structural schematic diagram of an array substrate according to a still further exemplary embodiment of the present disclosure.

In order to increase an aperture ratio of each pixel unit described above, preferably referring to FIG. 6, in the pixel unit, the one electrode of the voltage division capacitor 92 connected with the common electrode line 61 and the one electrode of the voltage compensation capacitor 91 connected with the second sub-pixel electrode 32 are arranged opposite to each other in the thickness direction of array substrate, that is, their orthogonal projections on a surface of the array substrate are at least partially overlapped with each other (as indicated by a broken circle shown in FIG. 6). With such a configuration, in a case where both areas of the two electrodes of the voltage division capacitor 92 and areas of the two electrodes of the voltage compensation capacitor 91 are not changed, an area of a shielding component of the display device for shielding the voltage division capacitor 92 and the voltage compensation capacitor 91 is reduced, thereby increasing the aperture ratio of each pixel unit.

Figure 7:
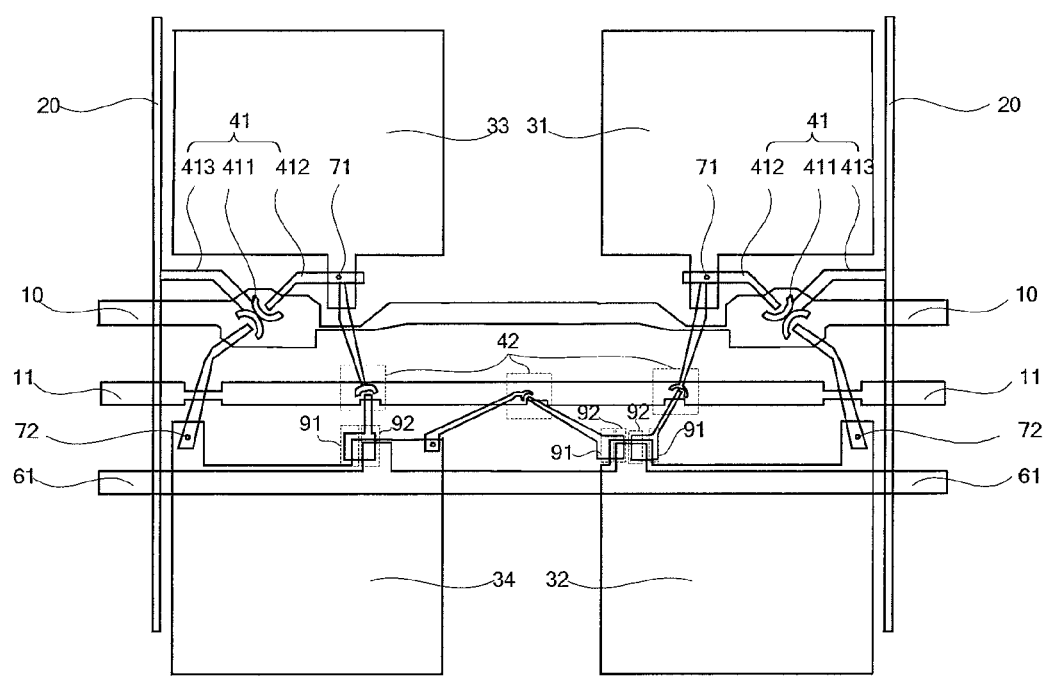
FIG. 7 is a structural schematic diagram of an array substrate according to a yet further exemplary embodiment of the present disclosure.

The above is described by taking the number of the sub-pixel electrodes of the pixel unit being two as an example; when the number of the sub-pixel electrodes of the pixel unit is more than two, the following arrangement may be implemented: the pixel unit comprises at least one voltage compensation unit 51 configured to charge the sub-pixel electrodes and at least one voltage division unit 52 configured to reduce voltages on the sub-pixel electrode. For example, referring to FIG. 7, when the number of the sub-pixel electrodes of the pixel unit is four, that is, when the pixel unit include a first sub-pixel electrode 31, a second sub-pixel electrode 32, a third sub-pixel electrode 33 and a fourth sub-pixel electrode 34, the pixel unit further comprises four first thin film transistors 41, three second thin film transistors 42, three voltage compensation capacitors 91, three voltage division capacitors 92 and common electrode lines 61. Width to length ratios of channels of respective first thin film transistors 41 are the same, width to length ratios of channels of respective second thin film transistors 42 are different from one another, and the width to length ratios of the channels of respective the second thin film transistor 42 are smaller than the width to length ratios of the channels of respective first thin film transistors 41.

In the above pixel unit, gates 411 of respective first thin film transistors 41 are electrically connected with gate lines 10, source electrodes 413 of respective first thin film transistor 41 are electrically connected with data lines 20, and each of drain electrodes 412 of respective first thin film transistor 41 is electrically connected with one corresponding sub-pixel electrode; one of the three second thin film transistors 42 has a source electrode 423 electrically connected with the first sub-pixel electrode 31, a gate 421 electrically connected with the gate line 10, and a drain electrode 422 disposed between the passivation layer 83 and the gate insulation layer 81 of the array substrate; one of the voltage compensation capacitors 91 has one electrode electrically connected with the drain electrode 422 of the second thin film transistor 42 and the other electrode electrically connected with the second sub-pixel electrode 32; one of the voltage division capacitors 92 has one electrode electrically connected with the drain electrode 422 of the second thin film transistor 42 and the other electrode electrically connected with the common electrode line 61; the source electrodes 423 of the other two second thin film transistors 42 are electrically connected with the other two sub-pixel electrodes respectively, the gates 421 of the other two second thin film transistors 42 are electrically connected with the gate lines 10, and the drain electrode 422 of the other two second thin film transistors 42 are disposed between the passivation layer 83 and the gate insulation layer 81 of the array substrate; each of the other two voltage compensation capacitors 91 has one electrode electrically connected with the drain electrode 422 of the corresponding one of the above other two second thin film transistors 42 and the other electrode electrically connected the second sub-pixel electrode 32 and the other electrode electrically connected with the fourth sub-pixel electrode 34. Each of the other two voltage division capacitors 92 has one electrode electrically connected with the drain electrode 422 of the corresponding one of the above other two second thin film transistors 42 and the other electrode electrically connected with the common electrode line 61.

During operation of the above array substrate, the four sub-pixel electrodes are charged by corresponding gate lines 10 through respectively first thin film transistors 41, and meanwhile parts of charges on the first sub-pixel electrode 31, the third sub-pixel electrode 33 and the fourth sub-pixel electrode 34 flows into corresponding voltage division capacitors 92 respectively; the width to length ratio of the channels of the three second thin film transistors 42 are different from each other, thus amounts of the charges flowing out from the first sub-pixel electrode 31, the third sub-pixel electrode 33 and the fourth sub-pixel electrode 34 are different from each other, and voltages on the first sub-pixel electrode 31, the third sub-pixel electrode 33 and fourth sub-pixel electrode 34 are smaller than the voltage on the second sub-pixel electrode 32 and are different from each other, such that deflection angles of liquid crystal molecules located within regions corresponding to the first sub-pixel electrode 31, the second sub-pixel electrode 32, the third sub-pixel electrode 33 and the fourth sub-pixel electrode 34 are different from one another, thereby improving a viewing angle of a display device; meanwhile, after charges on the second sub-pixel electrode 32, the third sub-pixel electrode 33 and the fourth sub-pixel electrode 34 are somewhat consumed, the second sub-pixel electrode 32, the third sub-pixel electrode 33 and the fourth sub-pixel electrode 34 will be supplemented with charges from three voltage compensation capacitors 92 respectively, such that voltages on the second sub-pixel electrode 32, the third sub-pixel electrode 33 and the fourth sub-pixel electrode 34 are always larger than the voltage on the first sub-pixel electrode; and further, respective voltage compensation capacitors 92 may be controlled such that amount of charges supplemented to the second sub-pixel electrode 32, the third sub-pixel electrode 33 and the fourth sub-pixel electrode 34 from the respective voltage compensation capacitors 92 are the same, such that the voltages on the second sub-pixel electrode 32, the third sub-pixel electrode 33 and the fourth sub-pixel electrode 34 are always different from each other, thereby further improving the viewing angle of the display device.

Hereinafter, a method of manufacturing the above array substrate will be described in detail with reference to FIG. 2 and FIG. 3, by taking the array substrate shown in FIG. 1 as an example. The method of manufacturing the above array substrate comprises:

Step 1: forming a gate line layer on a base substrate, including a pattern including the gate 411 of the first thin film transistor 41, the gate 421 of the second thin film transistor 42, the common electrode line 61 and one electrode of the voltage division capacitor 92 electrically connected with the common electrode line 61. For example, a metal layer is deposited on a base substrate 82 through sputtering, and photoresist coating, exposure, development and etching processes are sequentially performed on the metal layer, thereby forming a pattern including the gate line 10, the gate 411 of the first thin film transistor 41, the gate 421 of the second thin film transistor 42, the common electrode line 61 and one electrode of the voltage division capacitor 92 electrically connected with the common electrode line 61;

It is noted that if there is an auxiliary gate line and/or a plurality of thin film transistors in other embodiments, the auxiliary gate line and/or gates of respective thin film transistors may be formed in this step. In addition, if the common electrode line is not arranged in the same layer as the gate line in other embodiments, the common electrode line may be formed in other steps;

Step 2: forming a pattern including a gate insulation layer. For example, a gate insulation layer 21 is deposited through a Plasma Enhanced Chemical Vapor Deposition (PECVD) process to cover over the pattern including the gate line 10, the gate 411 of the first thin film transistor 41, the gate 421 of the second thin film transistor 42, the common electrode line 61 and the common electrode line 61;

Step 3: forming a pattern including an active layer. For example, a semiconductor layer is deposited on the gate insulation layer 21, exemplarily amorphous silicon (a-Si) may be deposited through PECVD or Indium Gallium Zinc Oxide (IGZO) is deposited through a sputtering process; and photoresist coating, exposure, development and etching processes are sequentially performed on the semiconductor layer, thereby forming a pattern including an active layer 84;

Step 4: forming a data line layer, including a pattern including the source electrode 413 and the drain electrode 412 of the first thin film transistor 41, the source electrode 423 and the drain electrode 422 of the second thin film transistor 42, one electrode of the voltage compensation capacitor 91 electrically connected with the drain electrode 422 of the second thin film transistor 42, and one electrode of the voltage division capacitor 92 electrically connected with the drain electrode 422 of the second thin film transistor 42. For example, a metal layer is deposited on the active layer 84 through a sputtering process, and photoresist coating, exposure, development and etching processes are sequentially performed on the metal layer, thereby forming a pattern including the data lines 20, the source electrode 413 and the drain electrode 412 of the first thin film transistor 41, the source electrode 423 and the drain electrode 422 of the second thin film transistor 42, one electrode of the voltage compensation capacitor 91 electrically connected with the drain electrode 422 of the second thin film transistor 42, and one electrode of the voltage division capacitor 92 electrically connected with the drain electrode 422 of the second thin film transistor 42;

It is noted that if there are a plurality of thin film transistors and/or other auxiliary structure(s) in other embodiments, source electrodes and drain electrodes of respective thin film transistors and/or corresponding auxiliary structure(s) may also be formed in this step;

Step 5: forming a pattern including a passivation layer with a through hole. For example, a passivation layer 83 is deposited to cover over the data lines 20, the source electrode 413 and the drain electrode 412 of the first thin film transistor 41, and the source electrode 423 and the drain electrode 422 of the second thin film transistor 42, and then photoresist coating, exposure, development and etching processes are sequentially performed on the passivation layer 83, thereby forming a first through hole 71, from which the drain electrode 412 of the first thin film transistor 41 is exposed, and a second through hole 72, from which the drain electrode 412 of another first thin film transistor 41 is exposed;

Step 6: forming a pattern including a sub-pixel electrode. For example, a conductive material layer of transparent metal oxide is sputtered on the passivation layer 83, and photoresist coating, exposure, development and etching processes are sequentially performed on the conductive material layer of transparent metal oxide, thereby forming the first sub-pixel electrode 31, the second sub-pixel electrode 32 and one electrode of the voltage compensation capacitor 91 electrically connected the second sub-pixel electrode 32; in an example, the first sub-pixel electrode 31 is electrically connected with the drain electrode 412 of the first thin film transistor 41 through the first through hole 71, and the second sub-pixel electrode 32 is electrically connected with the drain electrode 412 of another first thin film transistor 41 through the second through hole 72.

It is noted that if the sub-pixel electrode is used as an auxiliary electrode or a connection line in other embodiments, this may be also completed in the step 6.

It is noted that in embodiments of the present disclosure, the gate lines 10 and the data lines 20 may be manufactured from metal materials such as copper (Cu), aluminum (Al), molybdenum(Mo), titanium(Ti), chromium(Cr), tungsten (W) and the like, or may be manufactured from alloys of these materials; the gate line 10 may be a single layer structure, or may use a multi-layer structure, for example, Mo\Al\Mo, Ti\Cu\Ti, or Mo\Ti\Cu; the gate insulation layer 81 may be made of silicon nitride or silicon oxide; the gate insulation layer 81 may be a single layer structure, or may be a multi-layer structure, for example, including superposed silicon oxide layer and silicon nitride layer; the active layer 84 may be made of amorphous silicon or oxide semiconductor; the passivation layer 83 may be made of an inorganic material such as silicon nitride, or an organic material such as resin; the first sub-pixel electrode 31 and the second sub-pixel electrode 32 may be made of a conductive material, which may be exemplarily a transparent conductive oxide, including but not limited to Indium Zinc Oxide (IZO), Indium Tin Oxide (ITO) or other transparent and conductive metal oxide materials.

Of course, the above is only exemplarily described, and may be implemented in accordance with other process steps and approaches; for example, the gate insulation layer, the pattern of active layer, the pattern of source electrode and the pattern of drain electrode may be formed through one photolithography process; if there are other structures in respective steps, they may be obtained by those skilled in the art in specific embodiments in combination with corresponding process steps, which will not be repeated described here.

An embodiment of the present disclosure further provides a display panel, comprising the array substrate provided according to any of the embodiments as described above. In the array substrate provided according to the embodiment of the present disclosure, the pixel unit is provided with the voltage compensation unit 51 which may charge a sub-pixel electrode and the voltage division unit 52 which may reduce a voltage on a sub-pixel electrode, and the voltage compensation unit 51 and the voltage division unit 52 are adjusted such that voltages on respective sub-pixel electrodes are not all the same, thereby deflection angles of liquid crystal molecules located within regions corresponding to the sub-pixel electrode are different from each other, thereby enabling wide viewing-angle display of the display device.

An embodiment of the present disclosure further provides a display device, comprising the above display panel. Since the display device according to the embodiment of the present disclosure comprises the above display panel, advantages of the display device provided according to the embodiment of the present disclosure are the same as those of the above display panel over prior arts and will not be repeatedly described herein.

The display device according to the embodiment of the present disclosure may be an electronic paper, a mobile phone, a tablet computer, a television, a notebook computer, a digital photo frame, a navigator or other product or component that has a display function.

In the description of the above embodiments, specific features, structures, materials or characteristics may be combined in a suitable way in any or a plurality of embodiments or example.

The above described contents are merely preferred embodiments of the present disclosure, and not intended to limit the present disclosure. Any modification, substitution and improvement made within the spirit and principle of the present disclosure shall be included in the protective scope of the present invention. Thus, the protective scope of the present invention should be defined by the claims.

What is claimed is:

1. An array substrate, comprising a plurality of data lines and a plurality of gate lines arranged to cross each other, and a column of pixel units being disposed between adjacent data lines,
   wherein each of at least one pixel unit comprises at least two sub-pixel electrodes, a first thin film transistor for controlling charging and discharging of a corresponding one of the at least two sub-pixel electrodes, a voltage compensation unit configured to charge at least one of the at least two sub-pixel electrodes of the pixel unit, and a voltage division unit electrically connected with at least other one of the at least two sub-pixel electrodes of the pixel unit via a second thin film transistor and configured to reduce a voltage on the at least other one of the at least two sub-pixel electrodes of the pixel unit, and
   wherein the first thin film transistor and the second thin film transistor are electrically connected with a same one of the plurality of gate lines.

2. The array substrate according to claim 1, wherein the at least two sub-pixel electrodes include a first sub-pixel electrode and a second sub-pixel electrode, the pixel unit further comprises a common electrode line, the voltage compensation unit is electrically connected to the first sub-pixel electrode and the second sub-pixel electrode respectively, and the voltage division unit is electrically connected to the first sub-pixel electrode and the common electrode line.

3. The array substrate according to claim 2, wherein the voltage division unit comprises a voltage division capacitor and a voltage division thin film transistor, and the voltage compensation unit comprises a voltage compensation capacitor and a voltage compensation thin film transistor.

4. The array substrate according to claim 3, wherein a width to length ratio of a channel of the voltage division thin film transistor and a width to length ratio of a channel of the voltage compensation thin film transistor each are less than a width to length ratio of a channel of a first thin film transistor of the pixel unit for controlling charging and discharging of a corresponding sub-pixel electrode.

5. The array substrate according to claim 3, wherein the voltage division thin film transistor and the voltage compensation thin film transistor are the same thin film transistor which is defined as the second thin film transistor, the second thin film transistor having a source electrode electrically connected with the first sub-pixel electrode and a gate electrically connected with the gate line;
   wherein the voltage division capacitor has one electrode electrically connected with a drain electrode of the second thin film transistor and the other electrode electrically connected with the common electrode line; and
   wherein the voltage compensation capacitor has one electrode electrically connected with the drain electrode of the second thin film transistor and the other electrode electrically connected with the second sub-pixel electrode.

6. The array substrate according to claim 2, wherein the voltage division unit comprises a voltage division capacitor and a voltage division thin film transistor, and the voltage compensation unit comprises a voltage compensation capacitor and a voltage compensation thin film transistor, the voltage division thin film transistor and the voltage compensation thin film transistor are the same thin film transistor which is defined as a second thin film transistor;

wherein the pixel unit is further provided with an auxiliary gate line, to which a gate of the second thin film transistor is electrically connected, and a source electrode of the second thin film transistor is electrically connected with the first sub-pixel electrode;

wherein the voltage division capacitor has one electrode electrically connected with a drain electrode of the second thin film transistor and the other electrode electrically connected with the common electrode line; and wherein the voltage compensation capacitor has one electrode electrically connected with the drain electrode of the second thin film transistor and the other electrode electrically connected with the second sub-pixel electrode.

7. The array substrate according to claim 5, wherein the pixel unit further comprises an auxiliary electrode, which is located between the common electrode line and the drain electrode of the second thin film transistor, electrically connected with the common electrode line of the same pixel unit through an auxiliary through hole, and electrically connected with the one electrode of the voltage division capacitor of the same pixel unit.

8. The array substrate according to claim 7, wherein the auxiliary electrode is disposed in the same layer as the second sub-pixel electrode and is made of the same material as the second sub-pixel electrode.

9. The array substrate according to claim 7, wherein a distance between the auxiliary electrode and the drain electrode of the second thin film transistor in a thickness direction of array substrate is less than a distance between the common electrode line and the drain electrode of the second thin film transistor in the thickness direction.

10. The array substrate according to claim 3, wherein in the pixel unit, one electrode of the voltage division capacitor connected with the common electrode line is arranged opposite to one electrode of the voltage compensation capacitor connected with the second sub-pixel electrode in a thickness direction of array substrate.

11. The array substrate according to claim 5, wherein the one electrode of the voltage division capacitor and the drain electrode of the second thin film transistor are formed into an integral structure, and the other electrode of the voltage division capacitor and the common electrode line are formed into an integral structure; and wherein the one electrode of the voltage compensation capacitor and the drain electrode of the second thin film transistor are formed into an integral structure, and the other electrode of the voltage compensation capacitor and the second sub-pixel electrode are formed into an integral structure.

12. A display panel, comprising the array substrate as claimed in claim 1.

13. A display device, comprising the display panel as claimed in claim 12.

14. A method of manufacturing the array substrate according to claim 1, comprising:

providing a base substrate; and forming a plurality of pixel units on the base substrate, such that each of at least one pixel unit comprises at least two sub-pixel electrodes, a first thin film transistor for controlling charging and discharging of a corresponding one of the at least two sub-pixel electrodes, a voltage compensation unit configured to charge at least one of the at least two sub-pixel electrodes of the pixel unit and a voltage division unit electrically connected with at least other one of the at least two sub-pixel electrodes of the pixel unit via a second thin film transistor and configured to reduce a voltage on the at least other one of the at least two sub-pixel electrodes of the pixel unit, and the first thin film transistor and the second thin film transistor are electrically connected with a same one of the plurality of gate lines.

15. The method according to claim 14, wherein the forming a plurality of pixel units comprises:

forming a gate line layer on the base substrate, and patterning the gate line layer to form a first pattern including a gate line, a gate and a first electrode;

forming a second pattern including a gate insulation layer, the gate insulation layer at least covering over the gate and the first electrode;

forming a third pattern including an active layer on the gate insulation layer;

forming a data line layer on the active layer, and patterning the data line layer to form a fourth pattern including a source electrode, a drain electrode, a second electrode electrically connected with the drain electrode and a third electrode electrically connected the drain electrode, such that the gate, the gate insulation layer, the active layer, the source electrode and the drain electrode constitute a common thin film transistor, which is not only used as a voltage division thin film transistor of the voltage division unit but also as a voltage compensation thin film transistor of the voltage compensation unit, and the first electrode, the gate insulation layer and the second electrode constitute a voltage division capacitor of the voltage division unit;

forming a passivation layer over the fourth pattern; and forming a conductive material layer on the passivation layer, and patterning the conductive material layer to form a fifth pattern including a first sub-pixel electrode, a second sub-pixel electrode and a fourth electrode electrically connected the second sub-pixel electrode, such that the first sub-pixel electrode is electrically connected with the source electrode of the common thin film transistor, and the third electrode, the passivation layer and the fourth electrode constitute a voltage compensation capacitor of voltage compensation unit.

16. The method according to claim 15, wherein the forming a first pattern comprises electrically connecting the gate with the gate line.

17. The method according to claim 15, wherein the forming a first pattern comprises forming an auxiliary gate line, and connecting the auxiliary gate line with the gate of the common thin film transistor.

18. The method according to claim 17, wherein the auxiliary electrode is made of the same material as the second sub-pixel electrode and disposed in the same layer as the second sub-pixel electrode.

19. The method according to claim 15, wherein the forming a first pattern comprises forming a common electrode line from the gate line layer, such that the common electrode line is electrically connected with the first electrode of the voltage division capacitor.

20. The method according to claim 19, wherein the second electrode of the voltage division capacitor and the drain electrode of the common thin film transistor are formed into an integral structure, and the first electrode and the common electrode line are formed into an integral structure; and
wherein the third electrode of the voltage compensation capacitor and the drain electrode of the common thin film transistor are formed into an integral structure, and the fourth electrode and the second sub-pixel electrode are formed into an integral structure.

* * * * *